(12) United States Patent
Kao et al.

(10) Patent No.: US 12,224,028 B2
(45) Date of Patent: Feb. 11, 2025

(54) SEMICONDUCTOR CHIP AND SEQUENCE CHECKING CIRCUIT

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Shih-Cheng Kao, Hsinchu (TW); Bi-Yang Li, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 249 days.

(21) Appl. No.: 18/161,859

(22) Filed: Jan. 30, 2023

(65) Prior Publication Data

US 2024/0055067 A1    Feb. 15, 2024

(30) Foreign Application Priority Data

Aug. 12, 2022   (TW) .................................. 111130407

(51) Int. Cl.
G11C 29/50    (2006.01)
(52) U.S. Cl.
CPC .. *G11C 29/50004* (2013.01); *G11C 29/50012* (2013.01)

(58) Field of Classification Search
CPC ................. G11C 29/50004; G11C 29/50012
See application file for complete search history.

(56) References Cited

U.S. PATENT DOCUMENTS 7,542,857 B2 *   6/2009   Liaw ................ G01R 31/31717
                                                          702/57
2005/0024974 A1 *   2/2005   Noguchi ................ G11C 29/52
                                                          714/E11.034

FOREIGN PATENT DOCUMENTS

TW           I363271 B       5/2012
TW           I426285 B       2/2014

* cited by examiner

*Primary Examiner* — Xiaochun L Chen
(74) *Attorney, Agent, or Firm* — CKC & Partners Co., LLC

(57) ABSTRACT

A semiconductor chip includes a physical layer and a processing circuit. The physical layer includes at least one sequence checking circuit and at least one signal transmission path, wherein the at least one sequence checking circuit is configured to generate at least one test result signal according to a clock signal and at least one test data signal transmitted through the at least one signal transmission path, and the clock signal is not transmitted through the at least one signal transmission path. The processing circuit is electrically coupled to the physical layer and is configured to determine an operation status of the at least one signal transmission path according to the voltage level of the at least one test result signal.

20 Claims, 6 Drawing Sheets

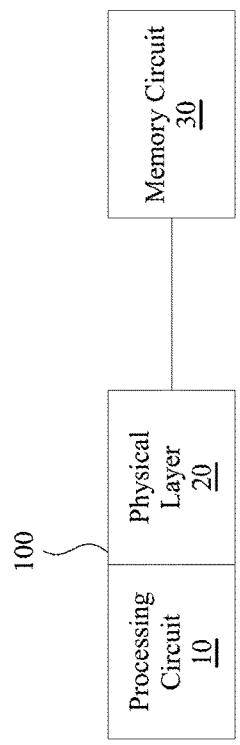
Fig. 6A
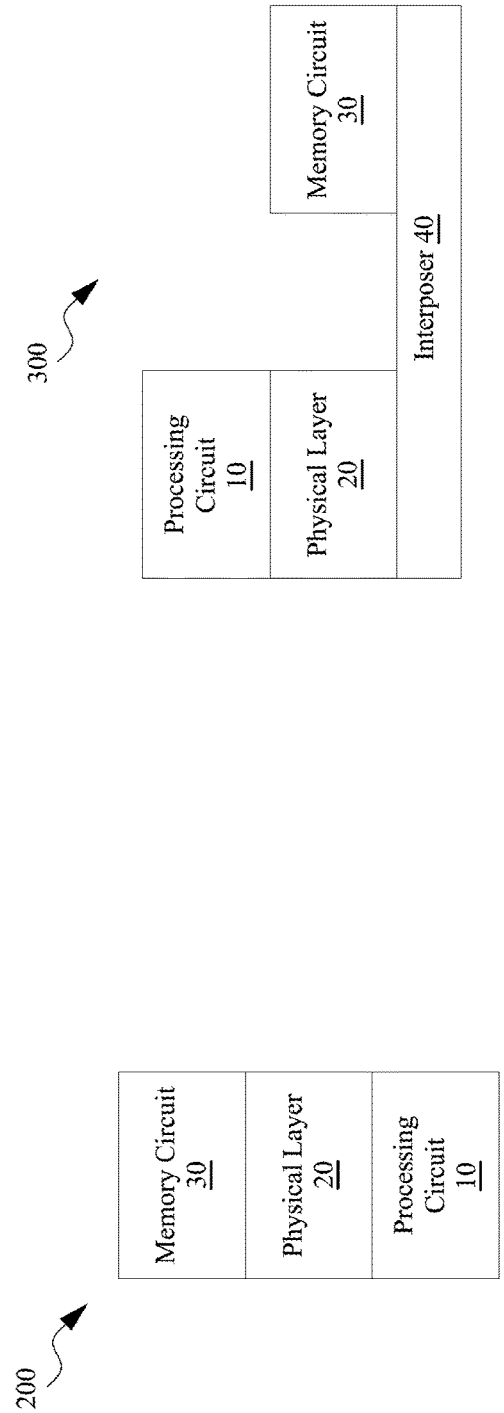
Fig. 6B
Fig. 6C

SEMICONDUCTOR CHIP AND SEQUENCE CHECKING CIRCUIT

RELATED APPLICATIONS

This application claims priority to Taiwan Application Serial Number 111130407, filed on Aug. 12, 2022, which is herein incorporated by reference in its entirety.

BACKGROUND

Field of Invention

The disclosure is related to a semiconductor chip. More particularly, the disclosure is related to a semiconductor chip including a sequence checking circuit.

Description of Related Art

In the specification of high-bandwidth memory, the command/address physical layer (CAPHY) is designed to have only transmitter terminals without receiver terminals. Therefore, in design for testability (DFT), the command/address physical layer is not like the data quadword physical layer (DQPHY) which has a data loopback mechanism for testing. In view of this, it is necessary to improve the existing design to meet the requirements.

SUMMARY

A semiconductor chip is provided in present disclosure. The semiconductor chip includes a physical layer and a processing circuit. The physical layer includes at least one sequence checking circuit and at least one signal transmission path, wherein the at least one sequence checking circuit is configured to generate at least one test result signal according to a clock signal and at least one test data signal transmitted through the at least one signal transmission path, and the clock signal is not transmitted through the at least one signal transmission path. The processing circuit is electrically coupled to the physical layer and configured to determine an operation status of the at least one signal transmission path according to the voltage level of the at least one test result signal.

A sequence checking circuit is provided in present disclosure. The sequence checking circuit is configured to check a test data signal transmitted through a signal transmission path of a physical layer and comprises a first shift register circuit, a second shift register circuit and an output terminal logic gate. The first shift register circuit is configured to perform a first checking to a data sequence of the test data signal according to a plurality of rising edges of a clock signal, so as to output a first checking result signal. The second shift register circuit is configured to perform a second checking to the data sequence of the test data signal according to a plurality of falling edges of the clock signal, so as to output a second checking result signal. The output terminal logic gate is configured to output a test result signal according to the voltage level of the first checking result signal and the voltage level of the second checking result signal, wherein the test result signal is configured to indicate an operation status of the signal transmission path. Wherein the clock signal is not transmitted through the signal transmission path.

With the sequence checking circuit, the semiconductor chip of the present disclosure may establish a data loopback mechanism suitable for the command/address physical layer in the situation that the original matching timing between the clock signal and the test data signal disappears, so as to improve the range of testability design.

It should be understood that both the foregoing general description and the following detailed description are by examples, and are intended to provide further explanation of the disclosure as claimed.

BRIEF DESCRIPTION OF THE DRAWINGS

FIG. 6A is a block diagram of a semiconductor chip in accordance with some embodiments of the present disclosure.

FIG. 6B is a block diagram of a semiconductor chip in accordance with some embodiments of the present disclosure.

FIG. 6C is a block diagram of a semiconductor chip in accordance with some embodiments of the present disclosure.

DETAILED DESCRIPTION

Reference will now be made in detail to the present embodiments of the disclosure, examples of which are illustrated in the accompanying drawings. However, the specific embodiments described below are only used to explain the present disclosure, and are not used to limit the present disclosure. The description of the structure and operation is not used to limit the order of its execution. The structures reassembled from components, resulting in devices with equal efficacy, are all within the scope of the present disclosure.

The terms used throughout the present disclosure, unless otherwise specified, generally have the ordinary meaning of each term used in the field, in the content disclosed herein and in the specific content.

The term "coupled" or "connected" used throughout the present disclosure may refer to two or more elements physically or electrically contact with each other in direct, or physically or electrically contact with each other in indirect, or two or more elements interact or act on each other.

For the convenience of description, the lowercase English indexes 1-n in the component symbols used in the description and the drawings of the present disclosure are only for convenience to refer to individual elements, and are not used to limit the number of the foregoing elements to a specific number. In the description and drawings of the present disclosure, if a certain component symbol is used without specifying the index of the component symbol, it means that the component symbol refers to any unspecified component in the component group to which it belongs. For example, the component that the component symbol 11[1] refers to is the signal generating circuit 11[1], and the object that the component symbol 11 refers to is any unspecified signal generating circuit in the signal generating circuits 11[1]-11[n].

Figure 1:
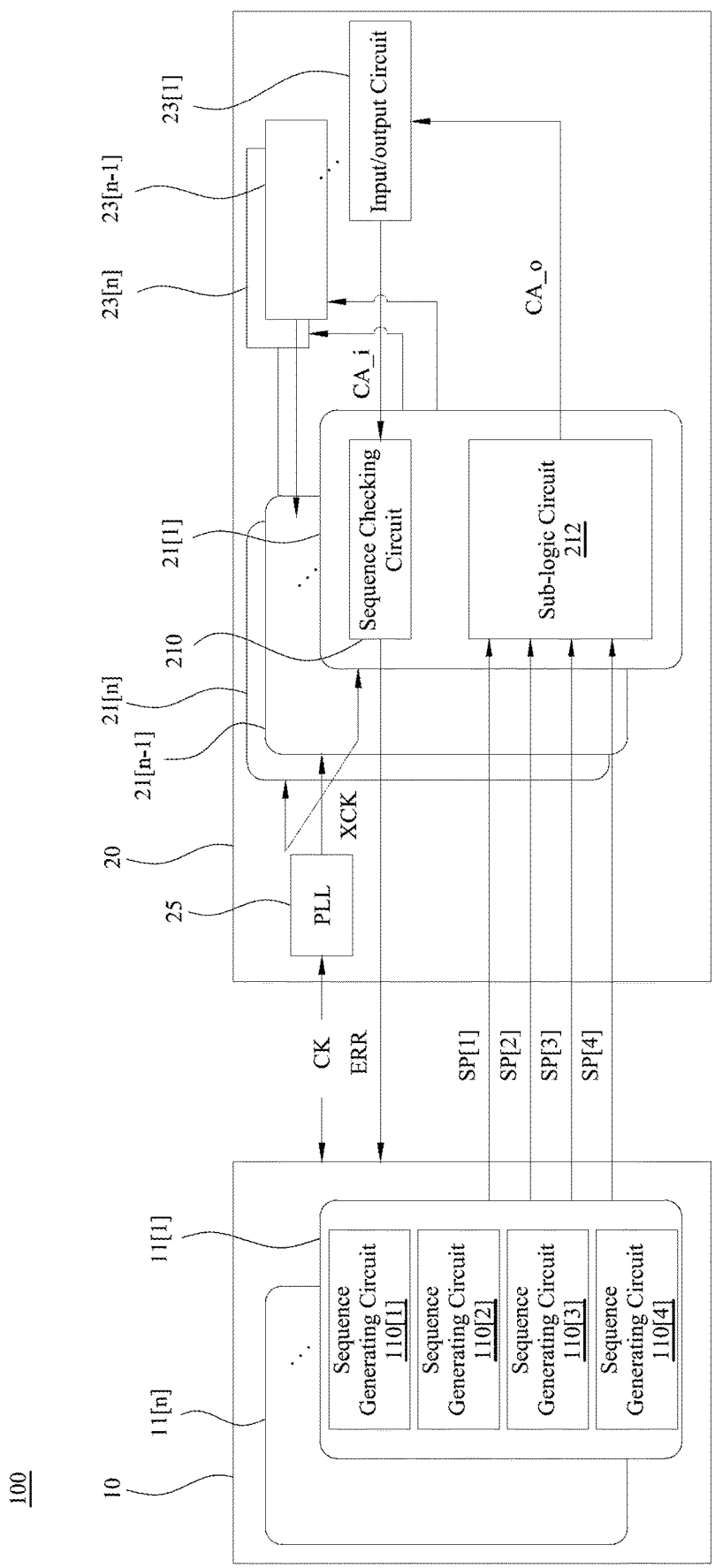
FIG. 1 is a block diagram of a semiconductor chip in accordance with some embodiments of the present disclosure.

Please refer to FIG. 1. FIG. 1 is a block diagram of a semiconductor chip 100 in accordance with some embodiments of the present disclosure. In some embodiments, as shown in FIG. 1, the semiconductor chip 100 includes a processing circuit 10 and a physical layer (PHY) 20. Specifically, the processing circuit 10 may be implemented by a system-on-chip (SoC), and the physical layer 20 may be implemented by a command/address physical layer (CA-PHY).

First, the structures of the processing circuit 10 and the physical layer 20 will be described in detail. In some embodiments, the processing circuit 10 includes at least one signal generating circuit 11. For example, in the embodiment of FIG. 1, the processing circuit 10 includes n signal generating circuits 11[1]-11[n], where n is a positive integer greater than 1.

In some embodiments, the n signal generating circuits 11[1]-11[n] have the same structure, but the present disclosure is not limited thereto. To simplify the description, the structure of the signal generating circuit 11 will be described in detail below by taking the signal generating circuit 11[1] as an example. As shown in FIG. 1, the signal generating circuit 11[1] includes a plurality of sequence generating circuits 110[1]-110[4], but the present disclosure is not limited thereto. Specifically, the sequence generating circuits 110[1]-110[4] are each implemented by a pseudo-random binary sequence (PRBS) generator. The structure of the PRBS generator is well known to those skilled in the art to which the present disclosure belongs, so it will not be repeated here.

In some embodiments, the physical layer 20 is electrically coupled to the processing circuit 10 and includes at least one logic circuit 21, at least one input/output (I/O) circuit 23 and a phase-locked loop (PLL) circuit 25. For example, in the embodiment of FIG. 1, the physical layer 20 includes n logic circuits 21[1]-21[n] and n input/output circuits 23[1]-23[n]. As shown in FIG. 1, the plurality of logic circuits 21[1]-21[n] are respectively electrically coupled to the plurality of input/output circuits 23[1]-23[n], and are also electrically coupled to the plurality of signal generating circuits 11[1]-11[n]. In addition, the phase-locked loop circuit 25 is coupled to the plurality of logic circuits 21[1]-21[n].

In some embodiments, the n logic circuits 21[1]-21[n] have the same structure, but the present disclosure is not limited thereto. To simplify the description, the structure of the logic circuit 21 will be described in detail below by taking the logic circuit 21[1] as an example. As shown in FIG. 1, the logic circuit 21[1] includes a sequence checking circuit 210 and a sub-logic circuit 212, and the sub-logic circuit 212 is coupled to the signal generating circuit 11[1]. Specifically, the sub-logic circuit 212 can be implemented by a parallel-to-serial conversion circuit. The structure of the parallel-to-serial conversion circuit is well known to those skilled in the art to which the present disclosure belongs, so it will not be repeated here. Corresponding to the sequence generating circuit 110 implemented by a PRBS generator, the sequence checking circuit 210 can be implemented by a PRBS checker. The structure of the sequence checking circuit 210 will be described in detail with reference to FIG. 2 in the following paragraphs.

In some embodiments, the n input/output circuits 23[1]-23[n] also have the same structure, but the present disclosure is not limited thereto. Specifically, each of the plurality of input/output circuits 23[1]-23[n] includes a transmission path (not shown in the figures) and a receiving path (not shown in the figures). The structure of the input/output circuits 23 is well known to those skilled in the art to which the present disclosure belongs, so it will not be repeated here.

Figure 2:
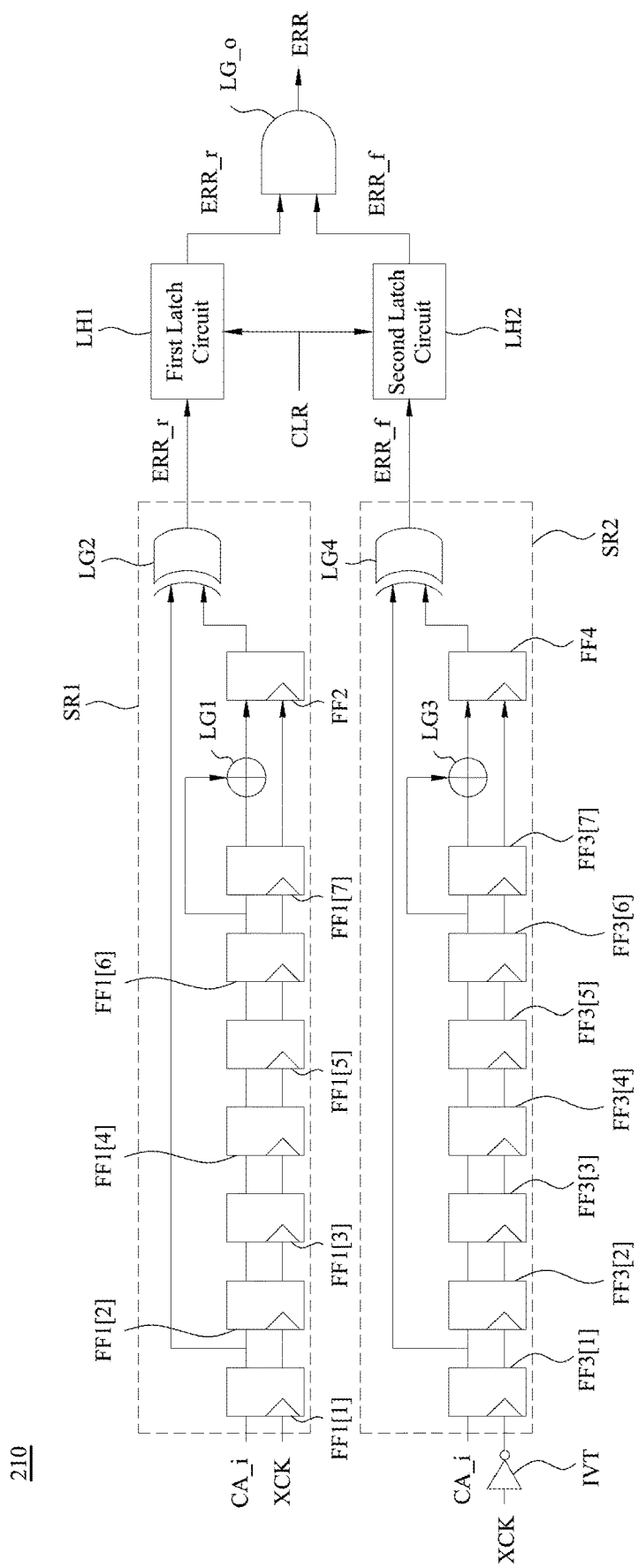
FIG. 2 is a circuit diagram of a sequence checking circuit in accordance with some embodiments of the present disclosure.

Please refer to FIG. 2. FIG. 2 is a circuit diagram of a sequence checking circuit 210 in accordance with some embodiments of the present disclosure. In some embodiments, as shown in FIG. 2, the sequence checking circuit 210 includes a first shift register circuit SR1, a second shift register circuit SR2, a first latch circuit LH1, a second latch circuit LH2 and an output terminal logic gate LG_o. Specifically, the first latch circuit LH1 is coupled between an output terminal of the first shift register circuit SR1 and a first input terminal of the output terminal logic gate LG_o, and the second latch circuit LH2 is coupled between an output terminal of the second shift register circuit SR2 and a second input terminal of the output terminal logic gate LG_o.

In addition, although not shown in FIG. 2, it should be understood that a data input terminal of the first shift register circuit SR1 and a data input terminal of the second shift register circuit SR2 are coupled to the input/output circuit 23 in FIG. 1, a clock input terminal of the first shift register circuit SR1 and a clock input terminal of the second shift register circuit SR2 are coupled to the phase-locked loop circuit 25 in FIG. 1, and an output terminal of the output terminal logic gate LG_o is coupled to the processing circuit 10 in FIG. 1.

In some embodiments, as shown in FIG. 2, the first shift register circuit SR1 includes a plurality of first flip-flops FF1[1]-FF1[7], a first logic gate LG1, a second flip-flop FF2 and a second logic gate LG2. The plurality of first flip-flops FF1[1]-FF1[7] are connected in series. The first logic gate LG1 is coupled to a data output terminal of the first flip-flop FF1[6], a data output terminal of the first flip-flop FF1[7] and a data input terminal of the second flip-flop FF2. The second logic gate LG2 is coupled to a data output terminal of the first flip-flop FF1[1] and a data output terminal of the second flip-flop FF2.

In some embodiments, as shown in FIG. 2, the second shift register circuit SR2 includes a plurality of third flip-flops FF3[1]-FF3[7], a third logic gate LG3, a fourth flip-flop FF4 and a fourth logic gate LG4. The plurality of third flip-flops FF3[1]-FF3[7] are connected in series. The third logic gate LG3 is coupled to a data output terminal of the third flip-flop FF3[6], a data output terminal of the third flip-flop FF3[7] and a data input terminal of the fourth flip-flop FF4. The fourth logic gate LG4 is coupled to a data output terminal of the third flip-flop FF3[1] and a data output terminal of the fourth flip-flop FF4.

In the embodiment of FIG. 2, each of the first logic gate LG1, the second logic gate LG2, the third logic gate LG3 and the fourth logic gate LG4 can be implemented by an exclusive-OR (XOR) gate, and the output terminal logic gate LG_o can be implemented by an AND gate. However, the present disclosure is not limited thereto. For example, in other embodiments, each of the first logic gate LG1 and the third logic gate LG3 can be implemented by an exclusive-OR (XOR) gate, each of the second logic gate LG2 and the fourth logic gate LG4 can be implemented by an exclusive-NOR (XNOR) gate, and the output terminal logic gate LG_o can be implemented by a NOR gate.

In some embodiments, the semiconductor chip 100 is configured to be electrically coupled to a memory circuit (not shown in FIG. 1). In this way, the processing circuit 10 can send command signals and/or address signals to the memory circuit through the physical layer 20. In some embodiments, the physical layer 20 is tested by the processing circuit 10 before the semiconductor chip 100 is packaged, so as to prevent the memory circuit from receiving wrong signals due to abnormal operation of the physical layer 20. The testing operation of the processing circuit 10 on the physical layer 20 will be described in detail below.

Please refer to FIG. 1 again, in some embodiments, the sequence generating circuit 110 is configured to generate a first data sequence SP according to a preset seed value (or an initial value). For example, the sequence generating circuit 110[1] is configured to generate a first data sequence SP[1] according to a first seed value, the sequence generating circuit 110[2] is configured to generate a first data sequence SP[2] according to a second seed value, the sequence generating circuit 110[3] is configured to generate a first data sequence SP[3] according to a third seed value, and the sequence generating circuit 110[4] is configured to generate a first data sequence SP[4] according to a fourth seed value. It should be understood that the first seed value, the second seed value, the third seed value and the fourth seed value may all be the same or all different, and may also be partially the same and partially different. Accordingly, the first data sequences SP[1]-SP[4] may all be the same or all different, or may be partially the same and partially different.

In some embodiments, the first data sequence SP includes a plurality of data values, and each data value may be a logic 1 or a logic 0. In other words, the first data sequence SP can be comprised of an arrangement of logic 1 and logic 0. It is worth noting that after the sequence generating circuit 110 outputs $2^M-1$ data values, the next $2^M-1$ data values output by the sequence generating circuit 110 will have the same arrangement as the previously output $2^M-1$ data values, where M is the order of the PRBS generator (4, 7, 15, 23, 31, etc.) It should be understood that the plurality of data values of the first data sequence SP are predictable in the condition that the seed values and the order of the PRBS generator are known.

Figure 3:
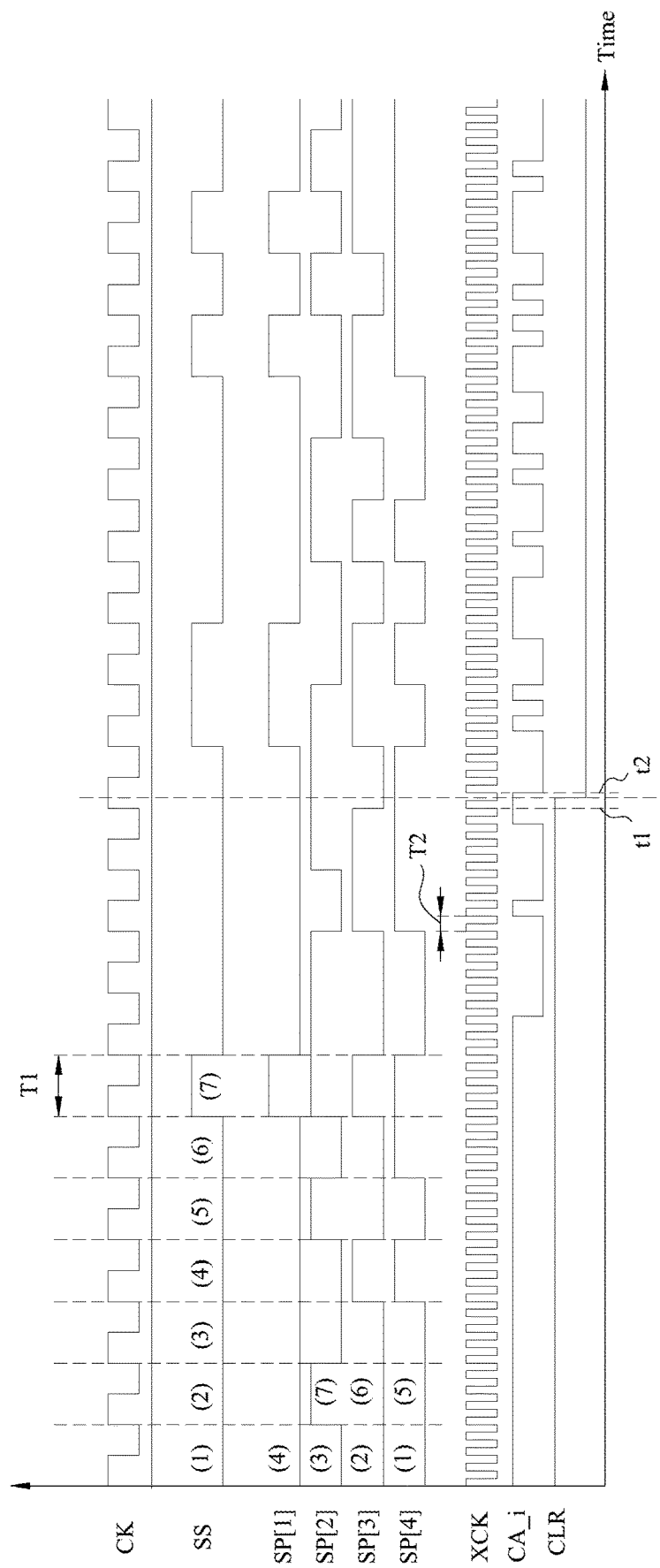
FIG. 3 is a timing diagram of a plurality of signals in the semiconductor chip in accordance with some embodiments of the present disclosure.

Please refer to FIG. 3. FIG. 3 is a timing diagram of a plurality of signals in the semiconductor chip 100 in accordance with some embodiments of the present disclosure. In some embodiments, by setting the first seed value, the second seed value, the third seed value and the fourth seed value, the signal generating circuit 11[1] may be regarded as outputting the plurality of data values of a reference data sequence SS in parallel through the plurality of sequence generating circuits 110[1]-110[4]. Taking the first seven data values in the reference data sequence SS (represented by numbers (1)-(7) in FIG. 3) as an example, with the triggering of a pulse in a clock signal CK, the data values numbered with (1)-(4) in the reference data sequence SS are output in parallel by the plurality of sequence generating circuits 110[1]-110[4]. Moreover, with the triggering of the next pulse in the clock signal CK, the data values numbered with (3)-(7) in the reference data sequence SS and the eighth data value not represented by the number are output in parallel by the plurality of sequence generating circuits 110[1]-110[4]. In addition, it should be understood that the number of the plurality of first data sequences SP and the number of the plurality of sequence generating circuits 110 can be changed according to requirements, and are not limited to four in FIG. 1 or FIG. 3. For example, in some embodiments, the signal generating circuit 11 includes at least one sequence generating circuit 110 for generating at least one first data sequence SP.

In some embodiments, as shown in FIG. 1, the phase-locked loop circuit 25 is configured to generate another clock signal XCK to the plurality of logic circuits 21[1]-21[n] according to the clock signal CK. As shown in FIG. 3, the clock signal CK has a period T1, and the clock signal XCK has another period T2, wherein the period T1 is greater than the period T2. In other words, the frequency of the clock signal XCK is higher than the frequency of the clock signal CK. In some embodiments, the frequency difference between the clock signal XCK and the clock signal CK corresponds to the number of the first data sequence SP. For example, the number of the first data sequences SP in FIG. 1 is four, and the frequency of the clock signal XCK in FIG. 3 is correspondingly four times the frequency of the clock signal CK, but the present disclosure is not limited thereto.

In some embodiments, the sub-logic circuit 212 is configured to receive at least one first data sequence SP to output a second data sequence CA_o. As shown in FIG. 1, the sub-logic circuit 212 is configured to receive a plurality of first data sequences SP[1]-SP[4] and convert the plurality of first data sequences SP[1]-SP[4] input in parallel into the second data sequence CA_o output in series according to the clock signal XCK. In some embodiments, as shown in FIG. 3, the ordering of the plurality of data values of the second data sequence CA_o is substantially the same as the ordering of the plurality of data values of the reference data sequence SS. The second data sequence CA_o differs from the reference data sequence SS only in the output frequency of the data values.

In some embodiments, the input/output circuit 23 is configured to receive the second data sequence CA_o through the aforementioned transmission path, and to transmit the second data sequence CA_o as a third data sequence CA_i to the sequence checking circuit 210 through the aforementioned receiving path. It is worth noting that the receiving path of the input/output circuit 23 is usually disabled, and is only enabled during the testing of the physical layer 20.

It can be seen from the above that when the sub-logic circuit 212 and the input/output circuit 23 function properly, the ordering of the plurality of data values of the second data sequence CA_o and the ordering of the plurality of data values of the third data sequence CA_i will be substantially the same as the ordering of the plurality of data values of the reference data sequence SS. In addition, when at least one of the sub-logic circuit 212 and the input/output circuit 23 does not function properly, the ordering of the plurality of data values of the third data sequence CA_i may be different from the ordering of the plurality of data values of the reference data sequence SS.

It is worth noting that, as shown in FIG. 1, the sequence checking circuit 210 of the present disclosure can check the third data sequence CA_i transmitted through the sub-logic circuit 212 and the input/output circuit 23, so as to generate a test result signal ERR to the processing circuit 10. In this way, the processing circuit 10 can determine the operation status of the sub-logic circuit 212 and the input/output circuit 23 of the physical layer 20 according to the test result signal ERR.

Please refer to FIG. 2 again, the sequence checking circuit 210 is configured to receive the third data sequence CA_i and the clock signal XCK. In some embodiments, the sub-logic circuit 212 and/or the input/output circuit 23 may be affected by the process, voltage and/or temperature, which leads to the disappearance of the original matching timing between the clock signal XCK and the third data sequence CA_i. It is worth noting that the sequence checking circuit 210 is configured to checks the data sequence of the third data sequence CA_i twice with the first shift register circuit SR1 and the second shift register circuit SR2, according to a plurality of rising edges and a plurality of falling edges of the clock signal XCK. In this way, the sequence checking circuit 210 of the present disclosure can avoid improperly checking the data sequence of the third data sequence CA_i which is due to the disappearance of the original matching timing between the clock signal XCK and the third data sequence CA_i.

Specifically, the first shift register circuit SR1 is configured to receive the third data sequence CA_i and the clock signal XCK, and check the data sequence of the third data sequence CA_i (i.e., the first checking) according to a plurality of rising edges of the clock signal XCK to output a first checking result signal ERR_r. The second shift register circuit SR2 is configured to receive the third data sequence CA_i and another clock signal (not shown in the figure) which is inverted from the clock signal XCK, wherein the another clock signal can be generated by inverting the clock signal XCK with a NOT gate. Accordingly, the second shift register circuit SR2 is configured to check the data sequence of the third data sequence CA_i (i.e., the second checking) according to a plurality of falling edges of the clock signal XCK to output a second checking result signal ERR_f.

Figure 4:
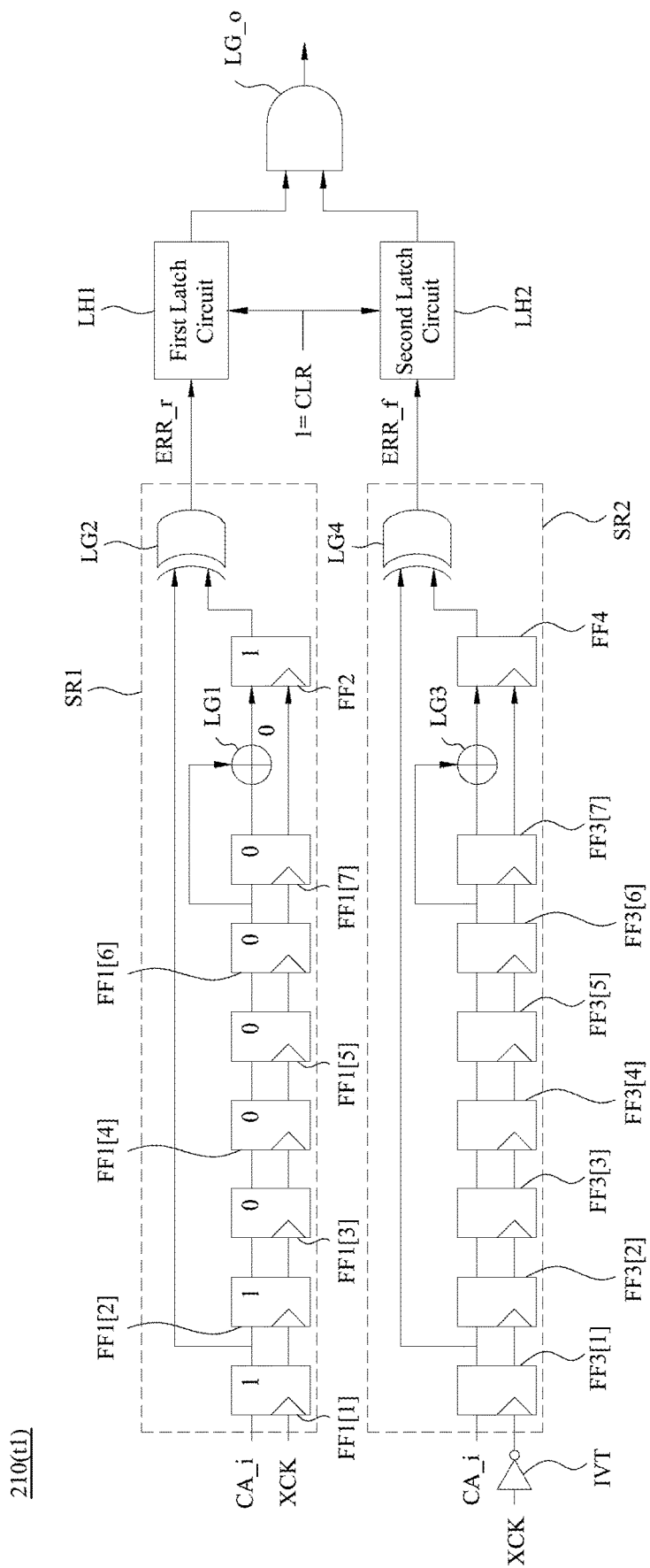
FIG. 4 is a circuit diagram of the sequence checking circuit at a first time in accordance with some embodiments of the present disclosure.

In some embodiments, the plurality of first flip-flops FF1[1]-FF1[7] in the first shift register circuit SR1 are configured to sequentially cache the plurality of data values of the third data sequence CA_i according to the plurality of rising edges of the clock signal XCK. The following description will take the embodiment of FIG. 4 as an example. Please refer to FIG. 4. FIG. 4 is a circuit diagram of the sequence checking circuit 210 at a first time t1 in accordance with some embodiments of the present disclosure. As shown in FIG. 3, the first time t1 corresponds to one of the plurality of rising edges of the clock signal XCK. At the first time t1, each of the plurality of first flip-flops FF1[1]-FF1[7] caches a corresponding one of the plurality of data values of the third data sequence CA_i. For example, as shown in FIG. 4, the first flip-flop FF1[1] caches a logic 1, the first flip-flop FF1[2] caches a logic 1, the first flip-flop FF1[3] caches a logic 0, the first flip-flop FF1[4] caches a logic 0, the first flip-flop FF1[5] caches a logic 0, the first flip-flop FF1[6] caches a logic 0, and the first flip-flop FF1[7] caches a logic 0.

As shown in FIG. 4, the first logic gate LG1 is configured to calculate a first calculation logic value (i.e., a logic 0) according to the data values cached by the first flip-flop FF1[6] and the first flip-flop FF1[7] at the first time t1 (i.e., two logic 0).

In addition, the second flip-flop FF2 is configured to cache the first calculation logic value calculated by the first logic gate LG1 according to the plurality of rising edges of the clock signal XCK. For example, at the first time t1, the second flip-flop FF2 caches the logic 1 calculated by the first logic gate LG1 before the first time t1, and the logic 0 calculated by the first logic gate LG1 at the first time t1 has not been cached by the second flip-flop FF2.

Figure 5:
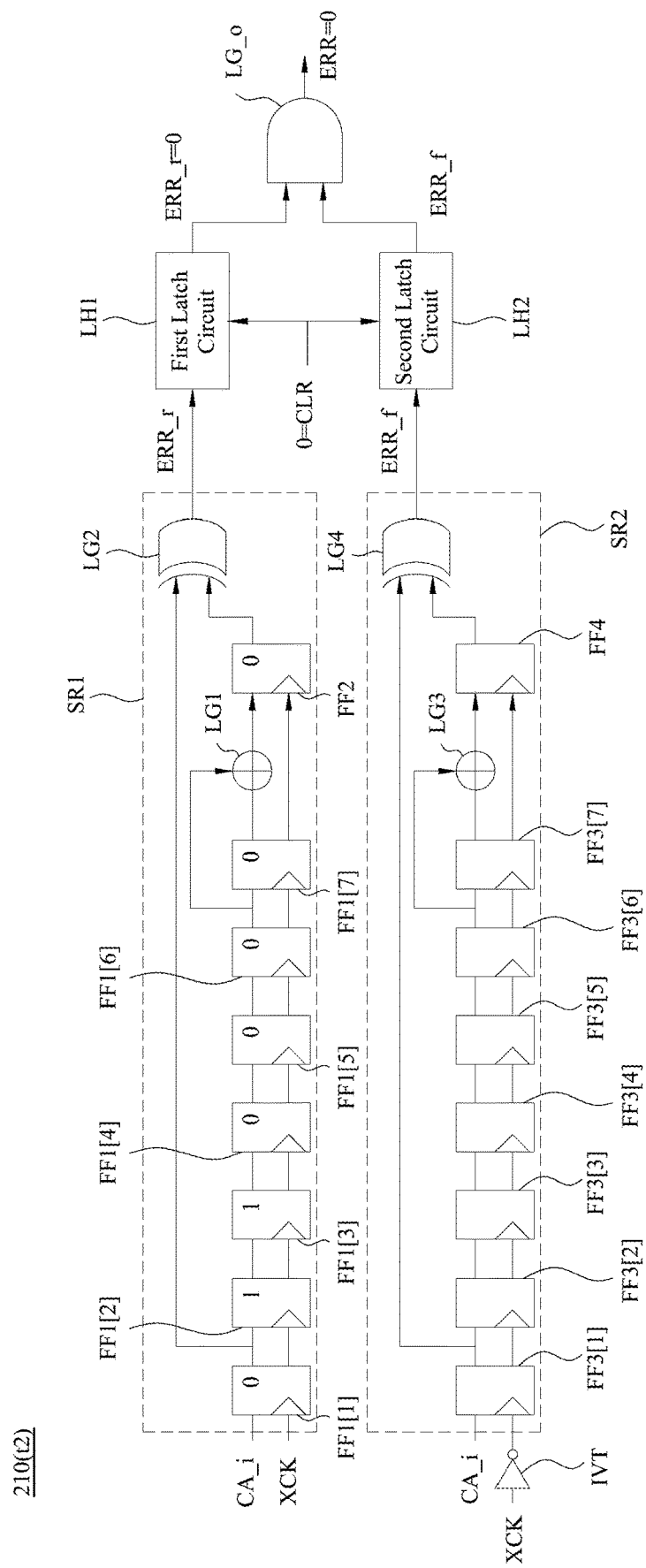
FIG. 5 is a circuit diagram of the sequence checking circuit at a second time in accordance with some embodiments of the present disclosure.

Please refer to FIG. 5. FIG. 5 is a circuit diagram of the sequence checking circuit 210 at a second time t2 in accordance with some embodiments of the present disclosure. As shown in FIG. 3, the second time t2 is after the first time t1 and corresponds to another one of the rising edges of the clock signal XCK. At the second time t2, each of the plurality of first flip-flops FF1[1]-FF1[7] caches the data value (which is also one of the plurality of data values of the third data sequence CA_i) received by its data input terminal. For example, as shown in FIG. 5, the first flip-flop FF1[1] caches the data value of the third data sequence CA_i at the second time t2 (i.e., the logic 0 as shown in FIG. 3), the first flip-flop FF1[2] caches the logic 1 cached by the first flip-flop FF1[1] at the first time t1, the first flip-flop FF1[3] caches the logic 1 cached by the first flip-flop FF1[2] at the first time t1, the first flip-flop FF1[4] caches the logic 0 cached by the first flip-flop FF1[3] at the first time t1, the first flip-flop FF1[5] caches the logic 0 cached by the first flip-flop FF1[4] at the first time t1, the first flip-flop FF1[6] caches the logic 0 cached by the first flip-flop FF1[5] at the first time t1, and the first flip-flop FF1[7] caches the logic 0 cached by the first flip-flop FF1[6] at the first time t1.

At the second time t2, the second flip-flop FF2 also caches the first calculation logic value (i.e., the logic 0) calculated by the first logic gate LG1 at the first time t1. In addition, the second logic gate LG2 is configured to calculate a first validation logic value (i.e., a logic 0) as the first checking result signal ERR_r according to the first calculation logic value and the data value cached by the first flip-flop FF1[1] at the second time t2 (i.e., the logic 0).

In conclusion, the first logic gate LG1 calculates the first calculation logic value according to the data values cached by two of the plurality of first flip-flops FF1[1]-FF1[7] (e.g., the first flip-flop FF1[6] and the first flip-flop FF1[7]) at the first time t1. Next, the second logic gate LG2 calculates the first validation logic value according to the first calculation logic value and the data value cached by another one of the plurality of first flip-flops FF1[1]-FF1[7] (e.g., the first flip-flop FF1[1]) at the second time t2.

It is worth noting that, because the first checking result signal ERR_r is logic 0 at the second time t2, the data value of the third data sequence CA_i at the second time t2 meets the expectation. It should be understood that if the first checking result signal ERR_r is logic 1 at a certain time, the data value of the third data sequence CA_i at the certain time fails to meet the expectation. Accordingly, the first checking result signal ERR_r output by the first shift register circuit SR1 can indicate whether the first checking result of the third data sequence CA_i is normal.

In some embodiments, the first latch circuit LH1 is configured to selectively output the first checking result signal ERR_r to the output terminal logic gate LG_o according to a control signal CLR. For example, as shown in FIG. 5, the first latch circuit LH1 outputs the first checking result signal ERR_r according to the control signal CLR with the first voltage level (e.g., logic 0).

It can be seen from the above that the checking to the third data sequence CA_i by the first shift register circuit SR1 is meaningful only after at least the first seven data values of the third data sequence CA_i are input to the first shift register circuit SR1. Therefore, the sequence checking circuit 210 sets a buffer time with the control signal CLR for not outputting the checking result, so as to avoid obtaining meaningless checking results. For example, in the embodiment of FIG. 4, the second logic gate LG2 also calculates a first validation logic value (i.e., logic 0) as the first checking result signal ERR_r according to the first calculation logic value calculated by the first logic gate LG1 before the first time t1 (i.e., the logic 1 cached by the second flip-flop FF2) and the data value cached by the first flip-flop FF1[1] at the first time t1 (i.e., logic 1). However, because the control signal CLR has a second voltage level (i.e., logic 1) different from the first voltage level at this time, the first latch circuit LH1 does not output the first checking result signal ERR_r.

As described above, the second shift register circuit SR2 is configured to check the data sequence of the third data sequence CA_i according to the plurality of falling edges of the clock signal XCK. Apart from this, the operation of the second shift register circuit SR2 is similar to the operation of the first shift register circuit SR1. That is, the third logic gate LG3 calculates a second calculation logic value according to the data values cached by two of the plurality of third flip-flops FF3[1]-FF3[7] (e.g., the third flip-flop FF3[6] and the third flip-flop FF3[7]) at a third time (not shown in the figure). Next, the fourth logic gate LG4 calculates the second validation logic value as the second checking result signal ERR_f according to the second calculation logic value and the data value cached by another one of the plurality of third flip-flops FF3[1]-FF3[7] (e.g., the third flip-flop FF3[1]) at a fourth time (not shown in the figure) after the third time. The second checking result signal ERR_f can indicate whether the second checking result of the third data sequence CA_i is normal. In addition, the second latch circuit LH2 is configured to selectively output the second checking result signal ERR_f generated by the second shift register circuit SR2 to the output terminal logic gate LG_o according to the control signal CLR. The operation of the second latch circuit LH2 is similar to the operation of the first latch circuit LH1, thus it is not repeated here.

In some embodiments, the output terminal logic gate LG_o is configured to output the test result signal ERR to the processing circuit 10 according to the voltage level of the first checking result signal ERR_r and the voltage level of the second checking result signal ERR_f.

Specifically, as shown in FIG. 5, when at least one of the first checking result signal ERR_r and the second checking result signal ERR_f has a first voltage level (e.g., logic 0), the output terminal logic gate LG_o outputs the test result signal ERR with the first voltage level. The processing circuit 10 determines that the sub-logic circuit 212 and the input/output circuit 23 function properly according to the test result signal ERR having the first voltage level. In other words, when at least one of the two checking results generated by the sequence checking circuit 210 is normal (i.e., at least one of the first checking result signal ERR_r and the second checking result signal ERR_f has the first voltage level), the processing circuit 10 determines that the sub-logic circuit 212 and the input/output circuit 23 function properly.

When both the first checking result signal ERR_r and the second checking result signal ERR_f have a second voltage level (e.g., logic 1) different from the first voltage level, the output terminal logic gate LG_o outputs the test result signal ERR with a second voltage level. The processing circuit 10 determines that at least one of the sub-logic circuit 212 and the input/output circuit 23 is not functioning properly according to the test result signal ERR having the second voltage level. In other words, when the two checking results generated by the sequence checking circuit 210 are both abnormal (i.e., the first checking result signal ERR_r and the second checking result signal ERR_f both have the second voltage level), the processing circuit 10 determines that at least one of the sub-logic circuit 212 and the input/output circuit 23 is not functioning properly. It can be seen from this that the test result signal ERR can indicate the operation status of the sub-logic circuit 212 and the input/output circuit 23 configured to transmit the third data sequence CA_i.

It can be seen from the above description that the sequence checking circuit 210 of the present disclosure is configured to check the test data signal (i.e., the third data sequence CA_i) transmitted through the signal transmission path (i.e., the sub-logic circuit 212 and the input/output circuit 23) of the physical layer 20, but the present disclosure is not limited thereto. In other embodiments, the sequence checking circuit 210 may receive and check the second data sequence CA_o as the test data signal, so as to individually test the operation status of the sub-logic circuit 212 (i.e., the signal transmission path).

In the above embodiments, the sequence generating circuit 110 is implemented by a 7-stage PRBS generator, thus the sequence checking circuit 210 is also implemented by a 7-stage PRBS checker. For example, the number of the plurality of first flip-flops FF1 of the first shift register circuit SR1 and the number of the plurality of third flip-flops FF3 of the second shift register circuit SR2 are both seven. However, the present disclosure is not limited thereto. When the order of the PRBS generator is changed, the number of the plurality of first flip-flops FF1 and the number of plurality of the third flip-flops FF3 are correspondingly changed, and the data values required for the calculation of the first logic gate LG1 and the third logic gate LG3 may also be obtained from different flip-flops correspondingly. In addition, the buffer time may also be lengthened or shortened as the order of the PRBS generator changes.

In the embodiment of FIG. 1, when the physical layer 20 is coupled to the memory circuit, the plurality of input/output circuits 23[1]-23[n−1] may be configured to transmit command signals and/or address signals to the memory circuit, and the input/output circuit 23[n] may be configured to transmit the clock signal to the memory circuit. In the prior art, when testing a plurality of input/output circuits, a specific clock signal (which may have a similar delay to the test data signal because the input/output circuit is affected by the process, voltage and/or temperature) is generated by inputting the clock signal XCK to the input/output circuit, the other input/output circuits configured to transmit the command signal and/or address signal is tested according to the test data signal and the specific clock signal, and whether the input/output circuit configured to transmit clock signals are functioning properly is judged according to the test results of the other input/output circuits configured to transmit command signals and/or address signals.

It is worth noting that, the input/output circuit 23[n] configured to transmit the clock signal and the other input/output circuits 23[1]-23[n−1] configured to transmit the command signals and/or the address signals are treated equally in the present disclosure. That is, each signal transmission path of the physical layer 20 is tested by transmitting the test data signal, and the clock signal XCK is not transmitted through the signal transmission path (i.e., the sub-logic circuit 212 and the input/output circuit 23) in the present disclosure. Therefore, compared with the prior art, the physical layer 20 of the present disclosure does not additionally generate a specific clock signal, which simplifies the testing and implementation process. In addition, the test data signal is checked twice by the sequence checking circuit 210, thus the situation that the test data signal is judged to have an abnormal data sequence because of the disappearance of the original matching timing between the test data signal and the clock signal XCK will not occur in the present disclosure.

Please refer to FIG. 1 and FIG. 6A. In the above embodiments, the semiconductor chip 100 is electrically coupled to the packaged memory circuit 30 after being packaged, but the present disclosure is not limited thereto. For example, please refer to FIG. 6B. FIG. 6B is a block diagram of a semiconductor chip 200 in accordance with some embodiments of the present disclosure. In some embodiments, as shown in FIG. 6B, the processing circuit 10, the physical layer 20 and the memory circuit 30 may be packaged together. In other words, the semiconductor chip 200 may include the processing circuit 10, the physical layer 20 and the memory circuit 30. In some embodiments, as shown in FIG. 6B, the physical layer 20 may be directly coupled to the memory circuit 30, but the present disclosure is not limited thereto. For example, please refer to FIG. 6C. FIG. 6C is a block diagram of a semiconductor chip 300 in accordance with some embodiments of the present disclosure. In some embodiments, the semiconductor chip 300 may further include an interposer 40, and the physical layer 20 and the memory circuit 30 are indirectly coupled to each other through the interposer 40. Specifically, the memory circuit 30 can be implemented by a high bandwidth memory.

It can be seen from the above-mentioned embodiments that, with the sequence checking circuit, the semiconductor chip of the present disclosure can create a data loopback mechanism suitable for the command/address physical layer in the condition that the original matching timing between the clock signal and the test data signal disappears.

The above are preferred embodiments of the present disclosure, and various modifications and equivalent changes may be made to the structure of the present disclosure without departing from the scope or spirit of the present disclosure. In view of the foregoing, it is intended that the present disclosure cover modifications and variations of this invention provided they fall within the scope of the following claims.

What is claimed is:

1. A semiconductor chip, including:
    a physical layer, including at least one sequence checking circuit and at least one signal transmission path, wherein the at least one sequence checking circuit is configured to generate at least one test result signal according to a clock signal and at least one test data signal transmitted through the at least one signal transmission path, and the clock signal is not transmitted through the at least one signal transmission path; and
    a processing circuit, electrically coupled to the physical layer and configured to determine an operation status of the at least one signal transmission path according to the voltage level of the at least one test result signal.

2. The semiconductor chip of claim 1, wherein the at least one sequence checking circuit is configured to check a data sequence of the at least one test data signal twice according to a plurality of rising edges of the clock signal and a plurality of falling edges of the clock signal.

3. The semiconductor chip of claim 2, wherein the at least one sequence checking circuit includes:
    a first shift register circuit, configured to check the data sequence of the at least one test data signal according to the plurality of rising edges of the clock signal, so as to output a first checking result signal;
    a second shift register circuit, configured to check the data sequence of the at least one test data signal according to the plurality of falling edges of the clock signal, so as to output a second checking result signal; and
    an output terminal logic gate, configured to output the at least one test result signal according to the voltage level of the first checking result signal and the voltage level of the second checking result signal.

4. The semiconductor chip of claim 3, wherein the first shift register circuit includes:
    a plurality of first flip-flops, connected in series and configured to sequentially cache a plurality of data values of the data sequence of the at least one test data signal according to the plurality of rising edges of the clock signal;
    a first logic gate, configured to calculate a first calculation logic value according to data values cached by a first one of the plurality of first flip-flops and a second one of the plurality of first flip-flops at a first time;
    a second flip-flop, configured to cache the first calculation logic value according to the plurality of rising edges of the clock signal; and
    a second logic gate, configured to calculate a first validation logic value as the first checking result signal, according to the first calculation logic value and data value cached by a third one of the plurality of first flip-flops at a second time after the first time.

5. The semiconductor chip of claim 3, wherein the second shift register circuit includes:
    a plurality of third flip-flops, connected in series and configured to sequentially cache a plurality of data values of the data sequence of the at least one test data signal according to the plurality of falling edges of the clock signal;
    a third logic gate, configured to calculate a second calculation logic value according to data values cached by a first one of the plurality of third flip-flops and a second one of the plurality of third flip-flops at a third time;
    a fourth flip-flop, configured to cache the second calculation logic value according to the plurality of falling edges of the clock signal; and
    a fourth logic gate, configured to calculate a second validation logic value as the second checking result signal, according to the second calculation logic value and data value cached by a third one of the plurality of third flip-flops at a fourth time after the third time.

6. The semiconductor chip of claim 3, wherein the at least one sequence checking circuit further includes:
    a first latch circuit, coupled between the first shift register circuit and the output terminal logic gate, and configured to selectively output the first checking result signal to the output terminal logic gate according to a control signal; and
    a second latch circuit, coupled between the second shift register circuit and the output terminal logic gate, and configured to selectively output the second checking result signal to the output terminal logic gate according to the control signal.

7. The semiconductor chip of claim 3, wherein when at least one of the first checking result signal and the second checking result signal has a first voltage level, the output terminal logic gate outputs the at least one test result signal having the first voltage level, and the processing circuit determines that the at least one signal transmission path is functioning properly according to the at least one test result signal having the first voltage level,
    wherein when both of the first checking result signal and the second checking result signal have a second voltage level different from the first voltage level, the output terminal logic gate outputs the at least one test result signal having the second voltage level, and the processing circuit determines that the at least one signal transmission path is not functioning properly according to the at least one test result signal having the second voltage level.

8. The semiconductor chip of claim 2, wherein when at least one of two checking results generated by the at least one sequence checking circuit is normal, the processing circuit determines that the at least one signal transmission path is functioning properly.

9. The semiconductor chip of claim 2, wherein the data sequence of the at least one test data signal is generated by at least one sequence generating circuit included in the processing circuit.

10. The semiconductor chip of claim 9, wherein the at least one sequence generating circuit is a pseudo-random binary sequence generator.

11. The semiconductor chip of claim 1, wherein the semiconductor chip further includes a memory circuit and the memory circuit is configured to be electrically coupled to the physical layer.

12. The semiconductor chip of claim 11, wherein the semiconductor chip further includes an interposer, and the physical layer and the memory circuit are coupled to each other through the interposer.

13. A sequence checking circuit, configured to check a test data signal transmitted through a signal transmission path of a physical layer, comprises:
   a first shift register circuit, configured to perform a first checking to a data sequence of the test data signal according to a plurality of rising edges of a clock signal, so as to output a first checking result signal;
   a second shift register circuit, configured to perform a second checking to the data sequence of the test data signal according to a plurality of falling edges of the clock signal, so as to output a second checking result signal; and
   an output terminal logic gate, configured to output a test result signal according to the voltage level of the first checking result signal and the voltage level of the second checking result signal, wherein the test result signal is configured to indicate an operation status of the signal transmission path,
   wherein the clock signal is not transmitted through the signal transmission path.

14. The sequence checking circuit of claim 13, wherein the first shift register circuit includes:
   a plurality of first flip-flops, connected in series and configured to sequentially cache a plurality of data values of the data sequence of the test data signal according to the plurality of rising edges of the clock signal;
   a first logic gate, configured to calculate a first calculation logic value according to data values cached by a first one of the plurality of first flip-flops and a second one of the plurality of first flip-flops at a first time;
   a second flip-flop, configured to cache the first calculation logic value according to the plurality of rising edges of the clock signal; and
   a second logic gate, configured to calculate a first validation logic value as the first checking result signal, according to the first calculation logic value and data value cached by a third one of the plurality of first flip-flops at a second time after the first time.

15. The sequence checking circuit of claim 14, wherein the first logic gate and the second logic gate are exclusive-OR (XOR) gates.

16. The sequence checking circuit of claim 13, wherein the second shift register circuit includes:
   a plurality of third flip-flops, connected in series and configured to sequentially cache a plurality of data values of the data sequence of the test data signal according to the plurality of falling edges of the clock signal;
   a third logic gate, configured to calculate a second calculation logic value according to data values cached by a first one of the plurality of third flip-flops and a second one of the plurality of third flip-flops at a third time;
   a fourth flip-flop, configured to cache the second calculation logic value according to the plurality of falling edges of the clock signal; and
   a fourth logic gate, configured to calculate a second validation logic value as the second checking result signal, according to the second calculation logic value and data value cached by a third one of the plurality of third flip-flops at a fourth time after the third time.

17. The sequence checking circuit of claim 16, wherein the third logic gate and the fourth logic gate are exclusive-OR (XOR) gates.

18. The sequence checking circuit of claim 13, wherein the sequence checking circuit further includes:
   a first latch circuit, coupled between the first shift register circuit and the output terminal logic gate, and configured to selectively output the first checking result signal to the output terminal logic gate according to a control signal; and
   a second latch circuit, coupled between the second shift register circuit and the output terminal logic gate, and configured to selectively output the second checking result signal to the output terminal logic gate according to the control signal.

19. The sequence checking circuit of claim 13, wherein the output terminal logic gate is an AND gate.

20. The sequence checking circuit of claim 13, wherein the signal transmission path includes a sub-logic circuit and an input/output circuit, the sub-logic circuit is configured to receive at least one first data sequence to output a second data sequence, and the input/output circuit is configured to receive the second data sequence to output a third data sequence,
   wherein the second data sequence or the third data sequence is configured to be the test data signal.

\* \* \* \* \*